United States Patent
Ito et al.

(10) Patent No.: US 9,082,854 B2
(45) Date of Patent: Jul. 14, 2015

(54) ELECTROOPTIC DEVICE SUBSTRATE FOR SHIELDING LIGHT FROM SWITCHING ELEMENT, ELECTROOPTIC DEVICE, AND ELECTRONIC APPARATUS

(71) Applicant: Seiko Epson Corporation, Tokyo (JP)

(72) Inventors: Satoshi Ito, Eniwa (JP); Hiroyuki Oikawa, Chitose (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/154,776

(22) Filed: Jan. 14, 2014

(65) Prior Publication Data

US 2014/0203285 A1 Jul. 24, 2014

(30) Foreign Application Priority Data

Jan. 18, 2013 (JP) ................................. 2013-006992

(51) Int. Cl.
*H01L 29/786* (2006.01)
*H01L 27/12* (2006.01)
*G02F 1/136* (2006.01)

(52) U.S. Cl.
CPC ........ *H01L 29/78633* (2013.01); *H01L 27/124* (2013.01); *H01L 27/1218* (2013.01); *G02F 1/136* (2013.01)

(58) Field of Classification Search
CPC ...................................................... G02F 1/136
See application file for complete search history.

(56) References Cited

U.S. PATENT DOCUMENTS

| | | | | |
|---|---|---|---|---|
| 7,554,120 B2* | 6/2009 | Ishii | ................................ | 257/72 |
| 8,130,333 B2 | 3/2012 | Egami | | |
| 8,144,281 B2* | 3/2012 | Nakagawa | ...................... | 349/44 |
| 8,259,248 B2 | 9/2012 | Nakagawa | | |
| 2008/0048190 A1 | 2/2008 | Ishii | | |

FOREIGN PATENT DOCUMENTS

| | | |
|---|---|---|
| JP | 2008-077030 A | 4/2008 |
| JP | 2008-151900 A | 7/2008 |
| JP | 2009-063958 A | 3/2009 |
| JP | 2010-191163 A | 9/2010 |
| JP | 2011-186108 A | 9/2011 |

* cited by examiner

*Primary Examiner* — Matthew Gordon
*Assistant Examiner* — Xia L Cross
(74) *Attorney, Agent, or Firm* — ALG Intellectual Property, LLC

(57) ABSTRACT

An electrooptic device substrate includes a scan line that is provided on an element substrate, a foundation insulating layer, a semiconductor layer provided on the foundation insulating layer, a gate insulating layer, recesses that are provided at both sides of the semiconductor layer so as to penetrate through the foundation insulating layer and the gate insulating layer, a gate electrode that is provided on the gate insulating layer and is electrically connected to the scan line in the recesses, an insulating interlayer that covers the gate insulating layer, the gate electrode, and the recesses, and a data line that is provided on the insulating interlayer so as to overlap with the scan line, the semiconductor layer, the gate electrode, and the recesses. The recesses include first recesses that overlap with the scan line and second recesses that extend to outer sides of the scan line.

12 Claims, 8 Drawing Sheets

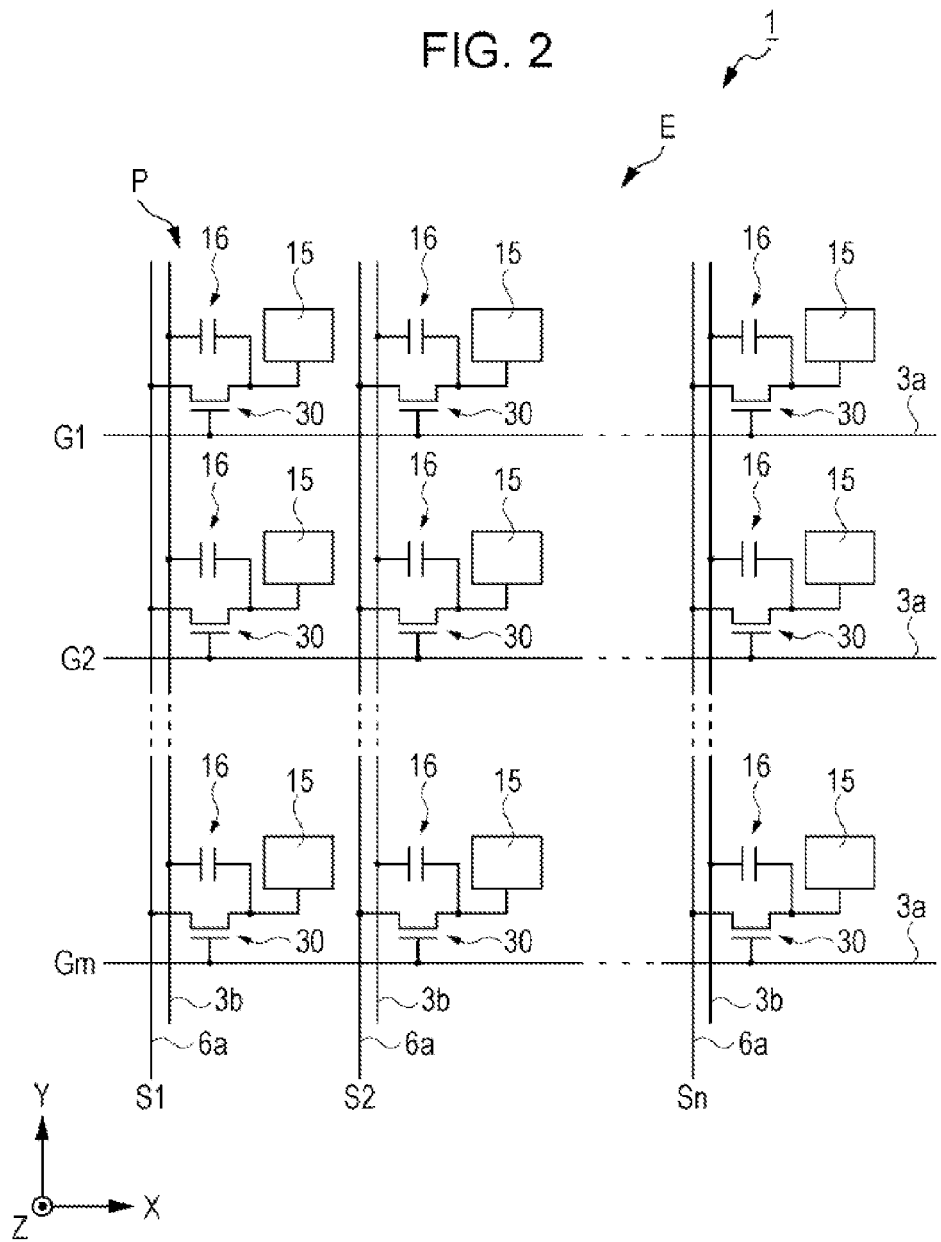

ELECTROOPTIC DEVICE SUBSTRATE FOR SHIELDING LIGHT FROM SWITCHING ELEMENT, ELECTROOPTIC DEVICE, AND ELECTRONIC APPARATUS

BACKGROUND

1. Technical Field

The present invention relates to an electrooptic device substrate, an electrooptic device, and an electronic apparatus.

2. Related Art

Known has been an electrooptic device including an electrooptic material (for example, liquid crystal or the like) between an element substrate on which a plurality of pixels and switching elements are provided and a counter substrate arranged so as to oppose the element substrate. As the electrooptic device, a liquid crystal device that is used as a liquid crystal light valve of a projector, and the like can be exemplified.

When intense light from a light source enters the liquid crystal light valve, if semiconductor layers constituting the switching elements are irradiated with the light, a light leakage current is generated and flicker and pixel unevenness occur on a display image. Therefore, for example, employed is a configuration in which data lines located at the upper-layer side of the semiconductor layers and scan lines located at the lower-layer side of the semiconductor layers block the light incident from the upper and lower directions of the semiconductor layers.

In the liquid crystal light valve, an aperture ratio of a pixel region through which light passes is required to be improved. If a light-shielding layer is made narrower in order to improve the aperture ratio, light is easy to be incident on the semiconductor layers obliquely from the sides of the light-shielding layer. In order to avoid this, disclosed is a technique of blocking light incident on the semiconductor layers obliquely in the flowing manner (for example, see JP-A-2008-77030). That is, grooves reaching the scan lines located at the lower-layer side of the semiconductor layers from an insulating layer located at the upper-layer side of the semiconductor layers are provided on regions overlapping with the scan lines at both sides of the semiconductor layers when seen from the above. Further, gate electrodes having a light shielding property are also provided in the grooves.

However, in a process of forming a conductive film serving as the gate electrodes, it is difficult to form the conductive film in the above-mentioned grooves, and portions on which the conductive film is not formed are generated partially in some cases. Moreover, when anneal processing for activating an impurity injected into the semiconductor layers is performed after the gate electrodes are formed, the gate electrodes are exposed at a high temperature. Because of this, an optical density (OD) value of a material constituting the gate electrodes is lowered, resulting in lowering the light shielding property of the gate electrodes. Then, the light incident on the semiconductor layers obliquely is not blocked sufficiently. Due to this, the light leakage current in the switching elements is increased and optical malfunction occurs, resulting in occurrence of flicker and display unevenness. This raises a problem that display quality of the liquid crystal device is lowered.

SUMMARY

An advantage of some aspects of the invention is to solve at least a part of the issues mentioned above and can be realized in the following modes or application examples.

Application Example 1

An electrooptic device substrate according to Application Example 1 which is provided with a switching element having a semiconductor layer and a gate electrode, includes a substrate, a scan line that is provided at an upper surface side of the substrate so as to extend in a first direction and has a light shielding property, a first insulating layer that covers the substrate and the scan line, the semiconductor layer that is provided on the first insulating layer so as to overlap with the scan line when seen from the above, a second insulating layer that covers the first insulating layer and the semiconductor layer, recesses that are provided at both sides of the semiconductor layer so as to penetrate through the first insulating layer and the second insulating layer and sandwich the semiconductor layer in a second direction intersecting with the first direction when seen from the above, the gate electrode that is provided on the second insulating layer so as to overlap with the scan line and a channel region of the semiconductor layer when seen from the above and is electrically connected to the scan line in the recesses, a third insulating layer that covers the second insulating layer, the gate electrode, and the recesses, and a data line that is provided on the third insulating layer so as to extend in the second direction and overlap with the scan line, the semiconductor layer, the gate electrode, and the recesses when seen from the above, and has a light shielding property. In the electrooptic device substrate, the recesses include first recesses that overlap with the scan line when seen from the above and second recesses that extend to outer sides of the scan line from the first recesses.

With the configuration in Application Example 1, the gate electrode provided at the upper-layer side of the semiconductor layer through the second insulating layer is electrically connected to the scan line in the recesses penetrating through the second insulating layer located at the upper-layer side of the semiconductor layer and the first insulating layer located at the lower-layer side of the semiconductor layer. Therefore, the gate electrode can block light incident on the lateral sides of the semiconductor layer. Further, the recesses include the first recesses that overlap with the scan line when seen from the above and the second recesses that extend to the outer sides of the scan line. With this, the third insulating layer and the data line having the light shielding property can be formed by being extended into the inner portions of the second recesses in comparison with the case where only the first recesses overlapping with the scan line are provided as the recesses. Accordingly, the data line can block light incident on the lateral sides of the semiconductor layer at the outer side relative to the gate electrode. With the configuration, the gate electrode and the data line can block light incident on the lateral sides of the semiconductor layer. This makes it possible to block light incident on the semiconductor layer obliquely, and provide the electrooptic device that includes the switching element which operates in a stable driving state for the incident light so as to achieve high display quality.

Application Example 2

In the electrooptic device substrate according to the above application example, it is preferable that the second recesses include portions extending along the second direction when seen from the above.

With the configuration of Application Example 2, the second recesses include the portions extending along the second direction in which the data line extends. Therefore, the data line can be made to easily enter into inner portions of the second recesses. This makes it possible to reliably block light incident on the semiconductor layer obliquely.

Application Example 3

In the electrooptic device substrate according to the above application example, it is preferable that the second recesses penetrate through the first insulating layer and the second insulating layer and be recessed from the upper surface of the substrate, and the gate electrode be formed on the scan line in the first recesses and be formed as far as a lower side relative to the scan line in the second recesses.

With the configuration of Application Example 3, the second recesses are recessed from the upper surface of the substrate, and the gate electrode formed on the scan line in the first recesses are formed as far as the lower side relative to the scan line in the second recesses. Therefore, the gate electrode can block light incident on the lateral sides of the semiconductor layer as far as the lower side relative to the scan line. This makes it possible to block light incident on the semiconductor layer obliquely more reliably.

Application Example 4

In the electrooptic device substrate according to the above application example, it is preferable that the data line be formed as far as a lower side relative to the scan line in the second recesses.

With the configuration of Application Example 4, the data line is formed as far as the lower side relative to the scan line in the second recesses. Therefore, the gate electrode and the data line can block light incident on the lateral sides of the semiconductor layer as far as the lower side relative to the scan line. This makes it possible to block light incident on the semiconductor layer obliquely more reliably.

Application Example 5

An electrooptic device according to Application Example 5 includes a first substrate on which a plurality of pixel electrodes and switching elements corresponding to the plurality of pixel electrodes are provided, a second substrate that is arranged so as to oppose the first substrate, and an electrooptic material layer that is provided between the first substrate and the second substrate. In the electrooptic device, the first substrate is the electrooptic device substrate according to the above-mentioned application examples.

With the configuration of Application Example 5, the first substrate included in the electrooptic device includes the electrooptic device substrate according to the above-mentioned application examples. Accordingly, the electrooptic device includes the switching elements which can obtain stable driving states for the incident light. This makes it possible to provide the electrooptic device having stable display quality.

Application Example 6

An electronic apparatus according to Application Example 6 includes the electrooptic device according to the above-mentioned application example.

With the configuration of Application Example 6, the electronic apparatus including the electrooptic device having stable display quality can be provided.

BRIEF DESCRIPTION OF THE DRAWINGS

The invention will be described with reference to the accompanying drawings, wherein like numbers reference like elements.

FIG. 2 is an equivalent circuit diagram illustrating an electric configuration of the liquid crystal device according to the first embodiment.

DESCRIPTION OF EXEMPLARY EMBODIMENTS

Figure 1A:
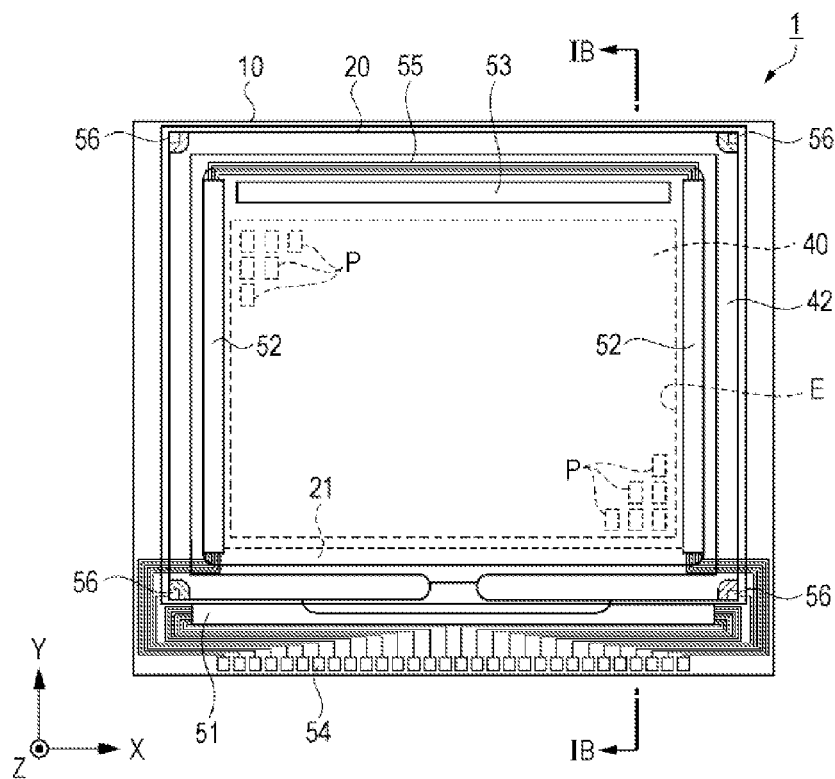
FIGS. 1A and 1B are schematic views illustrating a configuration of a liquid crystal device according to a first embodiment.

Hereinafter, described are embodiments to which the invention is embodied with reference to the accompanying drawings. The drawings to be used are illustrated in an enlarged, contracted, or exaggerated manner appropriately such that portions to be described are made into states of being recognized. Further, constituent components other than those necessary for description are not illustrated in the drawings in some cases.

In the following embodiments, for example, an expression "on a substrate" indicates the case where a constituent component is arranged on the substrate in a contact manner, the case where a constituent component is arranged on the substrate through another constituent component, or the case where a part of a constituent component is arranged on the substrate in a contract manner and another part thereof is arranged through another constituent component.

First Embodiment

Electrooptic Device

An electrooptic device is described by using an active matrix-type liquid crystal device including thin film transistors (TFTs) as switching elements of pixels as an example. For example, the liquid crystal device can be preferably used as a light modulator (liquid crystal light valve) of a projection-type display apparatus (projector), which will be described later.

Figure 1B:
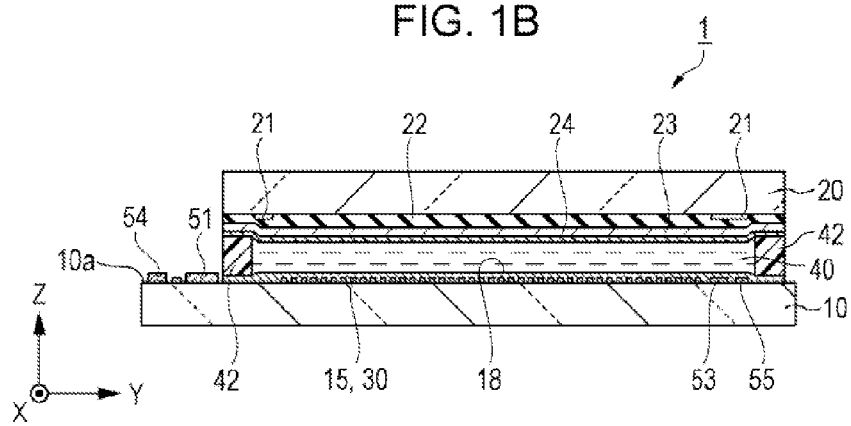

First, described is the liquid crystal device as the electrooptic device according to the first embodiment with reference to FIGS. 1A and 1B and FIG. 2. FIGS. 1A and 1B are schematic views illustrating a configuration of the liquid crystal device according to the first embodiment. To be specific, FIG. 1A is a schematic plan view illustrating the configuration of the liquid crystal device and FIG. 1B is a schematic cross-sectional view cut along a line IB-IB in FIG. 1A. FIG. 2 is an equivalent circuit diagram illustrating an electric configuration of the liquid crystal device according to the first embodiment.

As illustrated in FIGS. 1A and 1B, a liquid crystal device 1 according to the first embodiment includes an element substrate 10 as an electrooptic device substrate, a counter substrate 20 arranged so as to oppose the element substrate 10, and a liquid crystal layer 40 as an electrooptic material layer arranged between the element substrate 10 and the counter substrate 20. Substrates made of a material having light transmissivity, such as glass and quartz, are used for the element substrate 10 and the counter substrate 20, for example.

The element substrate 10 is slightly larger than the counter substrate 20 and both the substrates are bonded to each other through a sealing member 42 arranged in a frame form. The liquid crystal layer 40 is constituted by liquid crystal as an electrooptic material. The liquid crystal is injected into a space surrounded by the element substrate 10, the counter substrate 20, and the sealing member 42. The liquid crystal has positive or negative dielectric anisotropy.

The sealing member 42 is made of an adhesive such as a thermosetting or ultraviolet-curable epoxy resin, for example. A spacer (not illustrated) for keeping a constant space between the element substrate 10 and the counter substrate 20 is mixed into the sealing member 42. A frame-like light-shielding layer 21 is arranged at the inner side of the sealing member 42 arranged in the frame form. The light-shielding layer 21 is provided on the counter substrate 20. The light-shielding layer 21 is made of a metal or metal oxide having a light shielding property, for example.

The inner side of the light-shielding layer 21 corresponds to a display region E on which a plurality of pixels P are aligned. The display region E is a region substantially contributing to display on the liquid crystal device 1. Although not illustrated in FIGS. 1A and 1B, a light-shielding section defining the plurality of pixels P two-dimensionally is also provided in the display region E in a grid form, for example.

A data line driving circuit 51 and a plurality of external connection terminals 54 are provided on the element substrate 10 along one side thereof. The data line driving circuit 51 and the external connection terminals 54 are provided at the outer side of the sealing member 42 at the one side of the element substrate 10. A test circuit 53 is provided at the inner side of the sealing member 42 along another side opposing the one side. Further, scan line driving circuits 52 are provided at the inner side of the sealing member 42 along other two sides that are orthogonal to these two sides and oppose each other.

A plurality of wirings 55 connecting the two scan line driving circuits 52 are provided at the inner side of the sealing member 42 at another side on which the test circuit 53 is provided. The wirings connected to the data line driving circuit 51 and the scan line driving circuits 52 are connected to the plurality of external connection terminals 54. Further, vertical conducting portions 56 are provided in corners of the counter substrate 20. The vertical conducting portions 56 are provided for establishing electrical conduction between the element substrate 10 and the counter substrate 20. It is to be noted that arrangement of the test circuit 53 is not limited thereto and may be provided at a position along the inner side of the sealing member 42 between the data line driving circuit 51 and the display region E.

In the following description, the direction along one side on which the data line driving circuit 51 is provided is defined as an X direction as a first direction, and the direction along the other two sides that are orthogonal to the one side and oppose each other is defined as a Y direction as a second direction. The direction of a line IB-IB in FIG. 1A corresponds to a direction along the Y direction. In addition, the direction that is orthogonal to the X direction and the Y direction and directed to the upper side in FIG. 1B is defined as a Z direction. In the specification, what it is seen from the normal line direction (Z direction) of the surface of the counter substrate 20 of the liquid crystal device 1 is referred to as "when seen from the above".

As illustrated in FIG. 1B, TFTs 30 (see FIG. 2) as switching elements, pixel electrodes 15 having light transmissivity, signal wirings (not illustrated), and an alignment layer 18 are provided at a side of an upper surface 10a of the element substrate 10 on the liquid crystal layer 40 side. The TFTs 30 are provided for the respective pixels P. The alignment layer 18 covers the pixel electrodes 15. The pixel electrodes 15 are formed by a conductive film having light transmissivity, such as indium tin oxide (ITO) and indium zinc oxide (IZO).

The element substrate 10 in the embodiment employs a light-shielding configuration. The light-shielding configuration prevents occurrence of a problem that light is incident on semiconductor layers 30a (see FIG. 4) of the TFTs 30 and switching operations thereof become unstable. The light-shielding configuration will be described later.

The light-shielding layer 21, an interlayer 22, a common electrode 23, and an alignment layer 24 are provided on the counter substrate 20 on the liquid crystal layer 40 side. The alignment layer 24 covers the common electrode 23.

As illustrated in FIGS. 1A and 1B, the light-shielding layer 21 is provided in a frame form at a position overlapping with the scan line driving circuits 52, the plurality of wirings 55, and the test circuit 53 when seen from the above. The light-shielding layer 21 blocks light that is incident from the counter substrate 20 side so as to prevent malfunction of peripheral circuits including these driving circuits due to the light. In addition, the light-shielding layer 21 blocks light such that unnecessary stray light is not incident on the display region E so as to ensure high contrast on display on the display region E.

The interlayer 22 as illustrated in FIG. 1B is formed so as to cover the light-shielding layer 21. The interlayer 22 is formed by an insulating film such as silicon oxide ($SiO_2$), for example, and has light transmissivity. The interlayer 22 alleviates unevenness due to the light-shielding layer 21 and the like, and is provided such that the surface thereof at the liquid crystal layer 40 side on which the common electrode 23 is formed is flat. As a method of forming the interlayer 22, for example, a film formation method by using a plasma chemical vapor deposition (CVD) technique is exemplified.

The common electrode 23 is formed by a conductive film having light transmissivity, such as ITO and IZO, for example. The common electrode 23 covers the interlayer 22 and is electrically connected to the wirings at the element substrate 10 side by the vertical conducting portions 56 provided in four corners of the counter substrate 20, as illustrated in FIG. 1A.

The alignment layer 18 and the alignment layer 24 are selected based on optical design of the liquid crystal device 1. The alignment layer 18 and the alignment layer 24 are obtained by forming a film of an organic material such as polyimide and performing substantially horizontal alignment processing on liquid crystal molecules by rubbing the surface of the film, for example. Alternatively, the alignment layer 18 and the alignment layer 24 are obtained by forming a film of an inorganic material such as silicon oxide ($SiO_x$) by a vapor deposition method and performing substantially vertical alignment processing on liquid crystal molecules, for example.

Alignment and order of a molecular aggregate of the liquid crystal constituting the liquid crystal layer 40 are changed depending on applied voltage levels, so that the liquid crystal modulates light so as to make gradation display. For example, in the normally white mode, the transmissivity for the incident light is lowered in accordance with the voltage applied to each pixel P. In the normally black mode, the transmissivity for the incident light is increased in accordance with the voltage applied to each pixel P. Accordingly, light with contrast in accordance with image signals is emitted from the liquid crystal device 1 as a whole.

As illustrated in FIG. 2, scan lines 3a and data lines 6a are formed on the display region E so as to be insulated from and intersect with each other. The direction in which the scan lines 3a extend corresponds to the X direction as the first direction. The direction in which the data lines 6a extend corresponds to the Y direction as the second direction. The pixels P are provided so as to correspond to intersections between the scan lines 3a and the data lines 6a. The pixel electrode 15 and the thin film transistor (TFT) 30 as the switching element are provided for each pixel P.

Source electrodes (see FIG. 4) 31 of the TFTs 30 are electrically connected to the data lines 6a. The data lines 6a are connected to the data line driving circuit 51 (see FIGS. 1A and 1B). The data lines 6a supply image signals (data signals) S1, S2, . . . , and Sn that are supplied from the data line driving circuit 51 to the respective pixels P. The image signals S1, S2, . . . , and Sn that are supplied to the data lines 6a from the data line driving circuit 51 may be supplied in this order in a line sequential manner or may be supplied to groups each configured of a plurality of data lines 6a adjacent to one another.

Gate electrodes 30g (see FIG. 4) of the TFTs 30 are electrically connected to the scan lines 3a. The scan lines 3a are connected to the scan line driving circuits 52 (see FIGS. 1A and 1B). The scan lines 3a supply scan signals G1, G2, . . . , and Gm that are supplied from the scan line driving circuits 52 to the respective pixels P. The scan line driving circuits 52 supply the scan signals G1, G2, . . . , and Gm to the scan lines 3a at predetermined timings in a line sequential manner in a pulse form. Drain electrodes 32 (see FIG. 4) of the TFTs 30 are electrically connected to the pixel electrodes 15.

The image signals S1, S2, . . . , and Sn are written into the pixel electrodes 15 through the data lines 6a at predetermined timings by making the TFTs 30 into ON states for a constant period of time only. The image signals at predetermined levels, which have been written into the liquid crystal layer 40 through the pixel electrodes 15 in this manner, are held by liquid crystal capacitors for a constant period of time. The liquid crystal capacitors are formed between the pixel electrodes 15 and the common electrode 23 (see FIG. 1B) provided on the counter substrate 20.

In order to prevent the held image signals S1, S2, . . . , and Sn from leaking, holding capacitors 16 are formed between the capacitor lines 3b that are formed along the data lines 6a in parallel and the pixel electrodes 15. The holding capacitors 16 are arranged in parallel with the liquid crystal capacitor. If a voltage signal is applied to the liquid crystal of each pixel P, an alignment state of the liquid crystal changes depending on the applied voltage levels. With this, the light incident on the liquid crystal layer 40 (see FIGS. 1 and 1B) is modulated so as to make gradation display.

The data lines 6a are connected to the test circuit 53 as illustrated in FIG. 1A. In a manufacturing process of the liquid crystal device 1, the test circuit 53 detects the above-mentioned image signals, whereby an operation defect and the like of the liquid crystal device 1 can be checked. However, such configuration is not illustrated in the equivalent circuit in FIG. 2. The test circuit 53 may include a sampling circuit that samples the above-mentioned image signals and supplies them to the data lines 6a, and a pre-charge circuit that supplies pre-charge signals at a predetermined voltage level to the data lines 6a before supply of the image signals.

Figure 3:
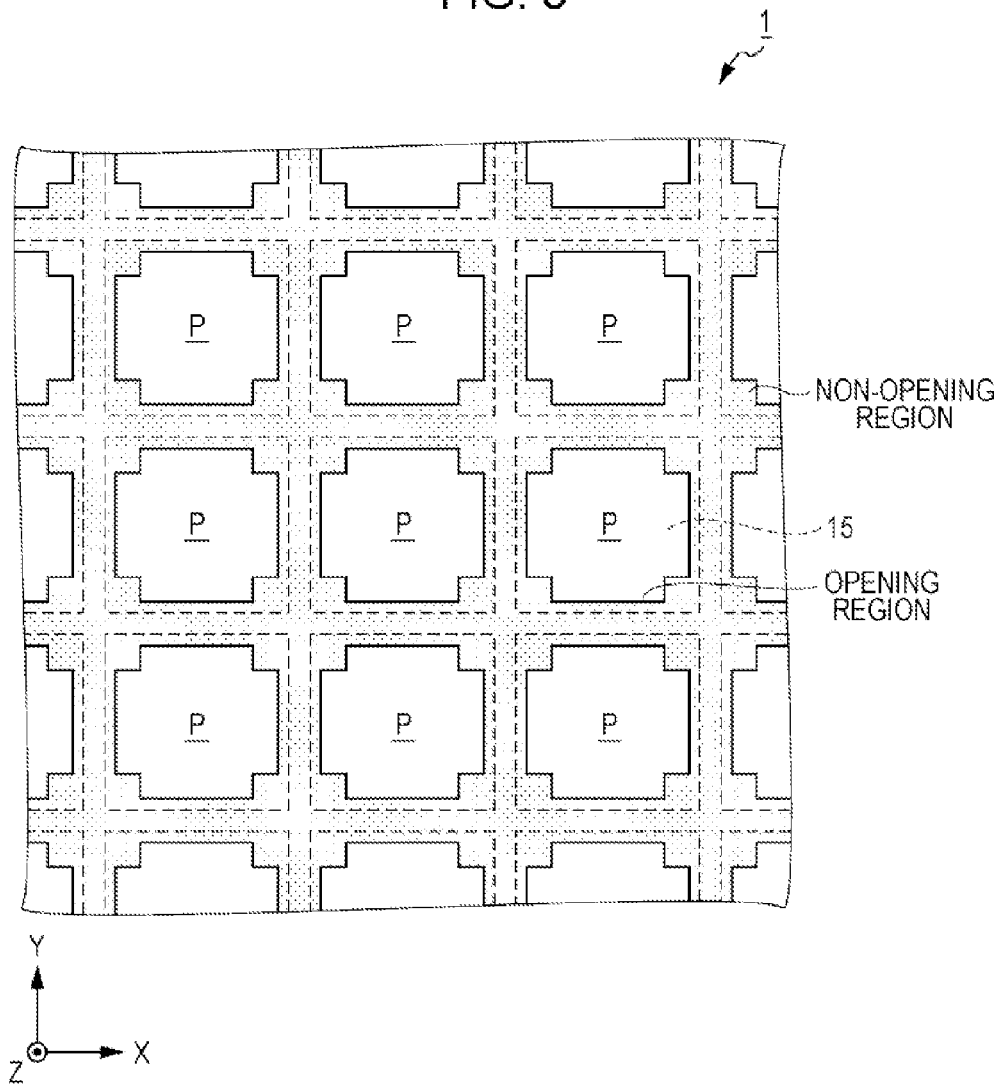
FIG. 3 is a schematic plan view illustrating arrangement of pixels in the liquid crystal device according to the first embodiment.
Figure 4:
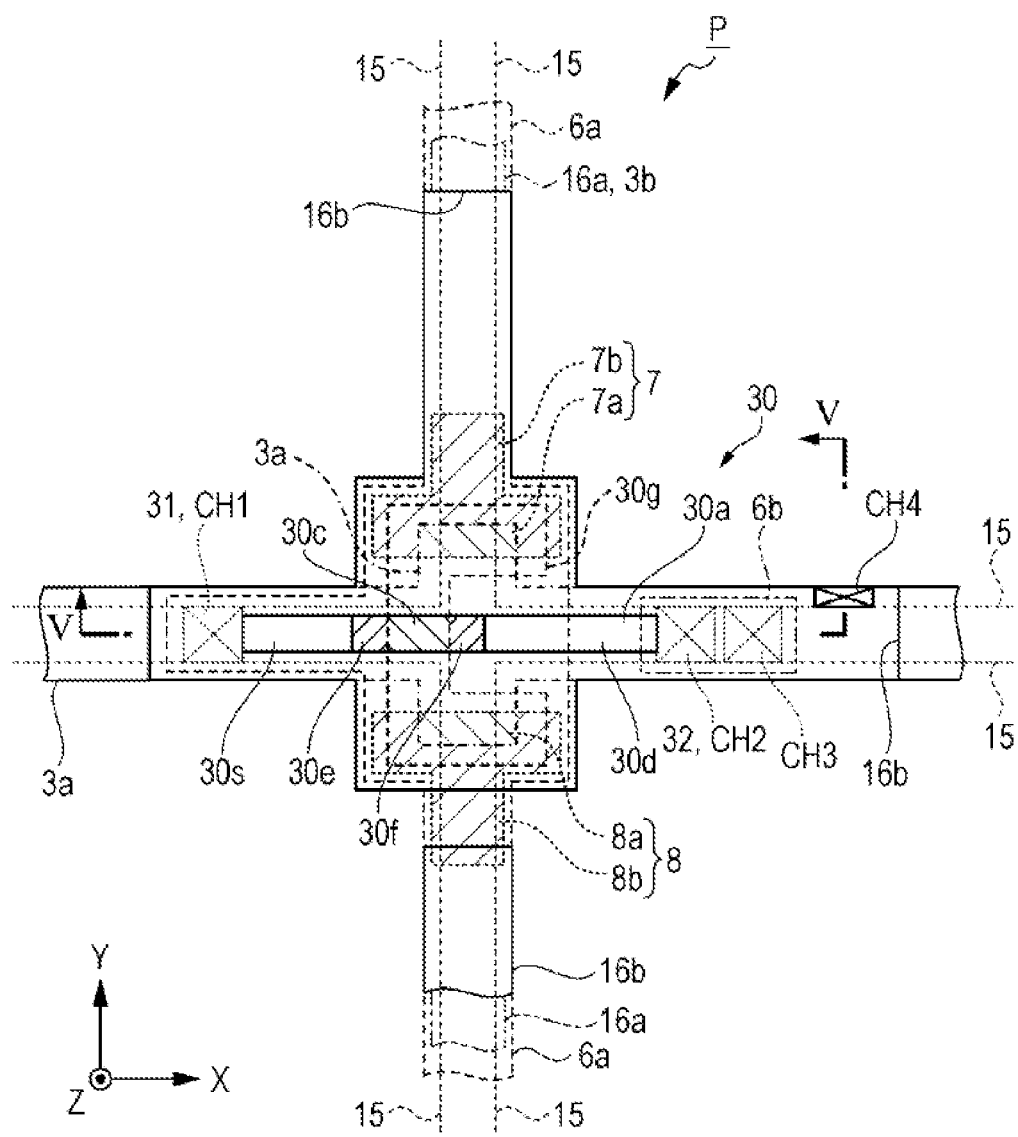
FIG. 4 is a schematic plan view illustrating a configuration of the pixel in the liquid crystal device according to the first embodiment.

Next, planar arrangement of the pixels P is described with reference to FIG. 3 and FIG. 4. FIG. 3 is a schematic plan view illustrating arrangement of the pixels in the liquid crystal device according to the first embodiment. FIG. 4 is a schematic plan view illustrating a configuration of the pixel in the liquid crystal device according to the first embodiment.

As illustrated in FIG. 3, the pixels P in the liquid crystal device 1 have opening regions of substantially square shapes when seen from the above, for example. The opening regions are surrounded by non-opening regions having a light shielding property. The non-opening regions extend in the X direction and the Y direction and are provided in a grid form.

The scan lines 3a as illustrated in FIG. 2 are provided on the non-opening regions extending in the X direction. A conductive member having the light shielding property is used for the scan lines 3a and at least a part of the non-opening regions are constituted by the scan lines 3a.

The data lines 6a and the capacitor lines 3b as illustrated in FIG. 2 are provided on the non-opening regions extending in the Y direction. The conductive member having the light shielding property is also used for the data lines 6a and the capacitor lines 3b and at least a part of the non-opening regions are constituted by the data lines 6a and the capacitor lines 3b.

The non-opening regions can be constituted by not only the above-mentioned signal lines provided at the element substrate 10 side but also the light-shielding layer 21 that has experienced patterning in the grid form at the counter substrate 20 side.

The TFTs 30 and the holding capacitors 16 as illustrated in FIG. 2 are provided in the vicinity of the intersections of the non-opening regions. The TFTs 30 are provided in the vicinity of the intersections of the non-opening regions having the light shielding property so as to prevent optical malfunction of the TFTs 30 and ensure aperture ratios of the opening regions. The widths of the non-opening regions in the vicinity of the intersections are larger than those of other portions because the TFTs 30 and the holding capacitors 16 are provided in the vicinity of the intersections.

As illustrated in FIG. 4, the TFTs 30 are provided at the intersections between the scan lines 3a extending in the X direction and the data lines 6a extending in the Y direction so as to correspond to the respective pixels P. Each TFT 30 includes the semiconductor layer 30a, the gate electrode 30g, the source electrode 31, and the drain electrode 32.

The semiconductor layer 30a has a lightly doped drain (LDD) structure including a source region 30s, a drain region 30d, a channel region 30c, a junction region 30e, and a junction region 30f. The junction region 30e is provided between the source region 30s and the channel region 30c. The junction region 30f is provided between the channel region 30c and the drain region 30d. The semiconductor layer 30a extends along the X direction while passing through the intersection between the scan line 3a and the data line 6a. The semiconductor layer 30a is arranged so as to overlap with the scan line 3a when seen from the above. It is to be noted that the semiconductor layer 30a may be configured so as not to have the LDD structure.

Each scan line 3a has projecting portions at each intersection between the scan line 3a and the data line 6a. The projecting portions project to both the sides in the Y direction when the seen from the above. The gate electrode 30g is provided so as to straddle the semiconductor layer 30a in the Y direction. The gate electrode 30g overlaps with the channel region 30c of the semiconductor layer 30a when seen from the above. Both ends of the gate electrode 30g in the Y direction oppose each other with the semiconductor layer 30a interposed therebetween and are provided so as to extend in the X direction. Further, both the ends of the gate electrode 30g in the Y direction overlap with the projecting portions of the scan line 3a when seen from the above.

A recess 7 and a recess 8 are arranged at both end sides of the semiconductor layer 30a in the Y direction. The recess 7 and the recess 8 are arranged so as to oppose each other with the semiconductor layer 30a interposed therebetween and overlap with both the ends of the gate electrode 30g in the Y direction when seen from the above. The recess 7 is constituted by a first recess 7a and a second recess 7b and the recess 8 is constituted by a first recess 8a and a second recess 8b. The recess 7 and the recess 8 serve as contact holes. The gate electrode 30g is electrically connected to the scan line 3a in the recess 7 and the recess 8. The structure of the intersection of the non-opening regions, which includes the recess 7 and the recess 8, will be described later.

Each data line 6a has enlarged portions and a projecting portion at each intersection between the data line 6a and the scan line 3a. The enlarged portions are enlarged in the X direction. The projecting portion extends along the X direction so as to project toward the side of the source region 30s of the semiconductor layer 30a from the enlarged portion. The enlarged portions of the data line 6a overlap with the gate electrode 30g when seen from the above. The projecting portion of the data line 6a overlaps with the scan line 3a and the semiconductor layer 30a when seen from the above.

A contact hole CH1 is provided so as to overlap with an end of the semiconductor layer 30a at the source region 30s side when seen from the above. The data line 6a is electrically connected to the source region 30s of the semiconductor layer 30a through the contact hole CH1 and a portion including the contact hole CH1 corresponds to the source electrode 31.

A contact hole CH2 is provided so as to overlap with an end of the semiconductor layer 30a at the drain region 30d side when seen from the above and a portion including the contact hole CH2 corresponds to the drain electrode 32. Further, a contact hole CH3 is provided so as to be adjacent to the contact hole CH2. The contact hole CH2 and the contact hole CH3 are electrically connected to each other by a relay electrode 6b provided in an island form.

The pixel electrodes 15 are provided such that outer edges thereof overlap with the scan lines 3a and the data lines 6a. In the embodiment, the pixel electrode 15 is electrically connected to the drain electrode 32 through two contact holes of the contact hole CH3 and a contact hole CH4 and a first capacitor electrode 16b that are provided at positions overlapping with the scan line 3a.

The holding capacitor 16 includes the first capacitor electrode 16b having the light shielding property and a light transmitting second capacitor electrode 16a arranged so as to oppose the first capacitor electrode 16b.

The first capacitor electrode 16b includes portions overlapping with the projecting portions of the scan line 3a and another portions extending in the extending direction of the scan line 3a and the extending direction of the data line 6a from the portions overlapping with the projecting portions. The first capacitor electrode 16b is arranged on the non-opening region (see FIG. 3). The first capacitor electrode 16b is provided in an island form independently for each pixel P. The first capacitor electrode 16b of the pixel P and the first capacitor electrode 16b of the adjacent pixel P are arranged so as to surround one pixel P and constitute the non-opening region having the light shielding property.

The second capacitor electrode 16a overlaps with the first capacitor electrode 16b when seen from the above. Although not illustrated in the drawing, the second capacitor electrode 16a includes a main wiring portion provided crossing a plurality of pixels P in the Y direction and a projecting portion projecting from the main wiring portion in the X direction. The main wiring portion and the projecting portion are provided so as to have substantially the same width as those of the first capacitor electrode 16b, the data lines 6a and the scan lines 3a. The second capacitor electrode 16a is provided so as to overlap with the first capacitor electrode 16b while excluding a region including the contact hole CH4 in which the pixel electrode 15 and the first capacitor electrode 16b are electrically connected to each other.

Although not illustrated in FIG. 4, a shield layer 35 (see FIG. 5) having a light shielding property is formed in the non-opening region so as to overlap with the scan line 3a and the data line 6a when seen from the above. Accordingly, the semiconductor layer 30a of the TFT 30 is provided being shielded from light on the non-opening region on which the scan line 3a, the data line 6a, the shield layer 35, the first capacitor electrode 16b, and the second capacitor electrode 16a overlap with one another when seen from the above.

Figure 5:
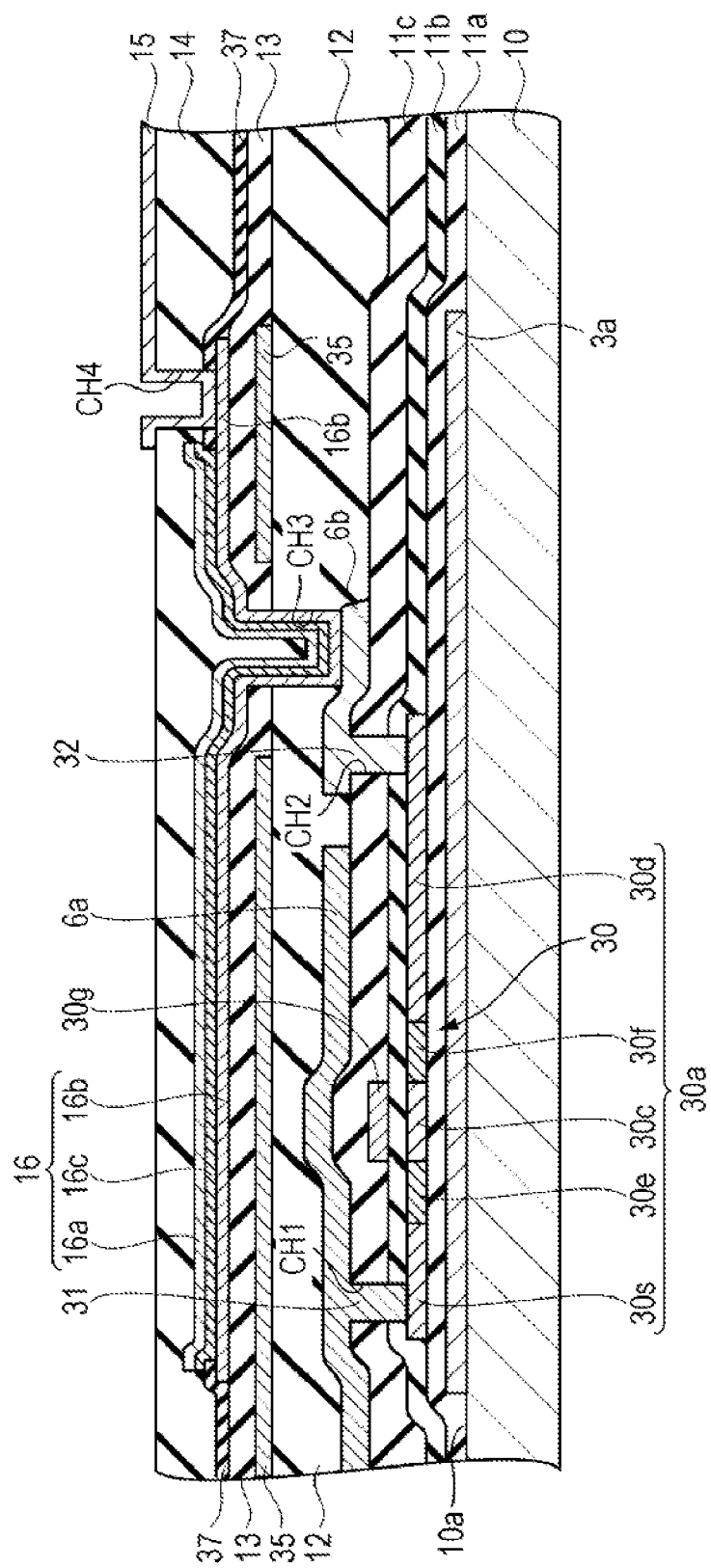
FIG. 5 is a schematic cross-sectional view illustrating a configuration of the pixel cut along a line V-V in FIG. 4.

Subsequently, described is the configuration of the pixel P with reference to FIG. 5. FIG. 5 is a schematic cross-sectional view illustrating a configuration of the pixel cut along a line V-V in FIG. 4. As illustrated in FIG. 5, the scan line 3a, the TFT 30, the data line 6a, the holding capacitor 16, and the pixel electrode 15 are provided on the element substrate 10.

The scan line 3a is formed on the upper surface 10a of the element substrate 10. The scan line 3a is made of a single metal, alloy, metal silicide, polysilicide, nitride, or a laminated material thereof, containing at least one of metals such as aluminum (Al), titanium (Ti), chromium (Cr), tungsten (W), tantalum (Ta), and molybdenum (Mo), for example. The scan line 3a has conductivity and a light shielding property.

A foundation insulating layer 11a as a first insulating layer is formed so as to cover the upper surface 10a of the element substrate 10 and the scan line 3a. The foundation insulating layer 11a is made of silicon oxide, for example. The semiconductor layer 30a is formed on the foundation insulating layer 11a in an island form. The semiconductor layer 30a is formed by a polycrystalline silicon film, for example, and impurity ions are injected into the semiconductor layer 30a so as to form the LDD structure including the source region 30s, the junction region 30e, the channel region 30c, the junction region 30f, and the drain region 30d as described above.

A gate insulating layer 11b as a second insulating layer is formed so as to cover the foundation insulting layer 11a and the semiconductor layer 30a. Further, the gate electrode 30g is formed on the gate insulating layer 11b at a position opposing the channel region 30c with the gate insulating layer 11b interposed therebetween.

An insulating interlayer 11c as a third insulating layer is formed so as to cover the gate insulating layer 11b and the gate electrode 30g. The contact hole CH1 is formed at a position overlapping with the end of the semiconductor layer 30a at the source region 30s side. The contact hole CH1 penetrates through the insulating interlayer 11c and the gate insulating layer 11b. Further, the contact hole CH2 is formed at a position overlapping with the end of the semiconductor layer 30a at the drain region 30d side. The contact hole CH2 penetrates through the insulating interlayer 11c and the gate insulating layer 11b.

The data line 6a and the relay electrode 6b are formed on the insulating interlayer 11c. The data line 6a and the relay electrode 6b are made of a single metal, alloy, metal silicide, polysilicide, nitride, or a laminated material thereof, containing at least one of metals such as Al, Ti, Cr, W, Ta, and Mo, for example. The data line 6a and the relay electrode 6b have conductivity and a light shielding property.

The data line 6a and the relay electrode 6b are obtained by forming conductive films using the same material and patterning the conductive films. Further, the contact hole CH1 is filled with the material forming the data line 6a and the relay electrode 6b, so that the source electrode 31 is formed. The contact hole CH2 is filled with the above material, so that the drain electrode 32 is formed.

An insulating interlayer 12 is formed so as to cover the data line 6a and the relay electrode 6b. The insulating interlayer 12 is made of silicon oxide or silicon nitride, for example. Flattening processing for flattening unevenness of the surface is performed on the insulating interlayer 12; the unevenness of the surface is generated by covering the region on which the TFT 30 is provided. As a method of the flattening processing, a chemical mechanical polishing (CMP) processing, a spin coat method, or the like can be employed, for example.

The shield layer 35 is formed on the insulating interlayer 12. The shield layer 35 has experienced patterning so as to overlap with the scan line 3a and the data line 6a when seen from the above. The shield layer 35 is formed by a conductive member having a light shielding property, such as Al, and blocks electromagnetic waves coming in so as to protect the TFT 30.

An insulating interlayer 13 is formed so as to cover the shield layer 35 and the insulating interlayer 12. The insulating interlayer 13 is made of silicon oxide or silicon nitride, for example. The flattening processing may be also performed on the insulating interlayer 13 in the same manner as that of the insulating interlayer 12.

The contact hole CH3 penetrating through the insulating interlayer 13 and the insulating interlayer 12 is formed at a position overlapping with the relay electrode 6b. The first capacitor electrode 16b is formed on the insulating interlayer 13 so as to overlap with the relay electrode 6b and the contact hole CH3 when seen from the above.

For example, the first capacitor electrode 16b is formed by a monolayer film made of Al, titanium nitride (TiN), or the like, or a multi-layer film obtained by laminating the monolayers. The first capacitor electrode 16b has conductivity and a light shielding property. The first capacitor electrode 16b is formed also in the contact hole CH3. With this, the first capacitor electrode 16b is electrically connected to the relay electrode 6b through the contact hole CH3 so as to be electrically connected to the drain electrode 32.

A protection layer 37 is formed so as to cover the insulating interlayer 13 and the outer edge portions of the first capacitor electrode 16b. For example, the protection layer 37 is formed by forming a protection film made of silicon oxide and patterning the protection film excluding a region on which a dielectric layer 16c is formed. As a method in which the protection film is partly removed for patterning, for example, a method of performing dry etching on the formed protection film partially, a lift-off technique of removing resist after the protection film is formed in a state where the surface of the first capacitor electrode 16b that need be removed has been masked by the resist or the like, and so on can be cited.

The dielectric layer 16c is formed so as to overlap with the first capacitor electrode 16b. For example, the dielectric layer 16c is formed by forming a dielectric film so as to cover the first capacitor electrode 16b and the protection layer 37, and patterning the dielectric film excluding a portion thereof which overlaps with the contact hole CH4 of the first capacitor electrode 16b. As the dielectric film, a monolayer film made of silicon nitride, hafnium oxide ($HfO_2$), alumina ($Al_2O_3$), tantalum oxide ($Ta_2O_3$) or the like, or a multi-layer film by laminating at least two types of the monolayer films can be used.

Further, the second capacitor electrode 16a is formed on the dielectric layer 16c so as to be substantially superimposed on the dielectric layer 16c. The first capacitor electrode 16b is covered by the protection layer 37 and the dielectric layer 16c. Therefore, even when the first capacitor electrode 16b and the second capacitor electrode 16a are made of the same material, for example, a problem that the first capacitor electrode 16b is etched when the second capacitor electrode 16a experiences patterning can be prevented from occurring.

The first capacitor electrode 16b, the second capacitor electrode 16a, and the dielectric layer 16c interposed between these electrodes constitute the holding capacitor 16. An insulating interlayer 14 is formed so as to cover the holding capacitor 16 and the protection layer 37. The insulating interlayer 14 is made of silicon oxide or silicon nitride, for example. The flattening processing may be performed on the insulating interlayer 14 in the same manner as that of the insulating interlayer 13.

The contact hole CH4 penetrating through the insulating interlayer 14 is formed at a position overlapping with the first capacitor electrode 16b. The pixel electrode 15 is formed on the insulating interlayer 14 so as to overlap with the first capacitor electrode 16b and the contact hole CH4 when seen from the above. The pixel electrode 15 is formed by a transparent conductive film such as ITO and is also formed in the contact hole CH4. With this, the pixel electrode 15 is electrically connected to the first capacitor electrode 16b through the contact hole CH4, and is electrically connected to the drain electrode 32 through the contact hole CH3 and the relay electrode 6b.

As described above, the first capacitor electrode 16b is electrically connected to the drain electrode 32 of the TFT 30, and is electrically connected to the pixel electrode 15. Further, as described above, the main wiring portion of the second capacitor electrode 16a is formed crossing the plurality of pixels P in the extending direction (Y direction) of the data line 6a, and also functions as the capacitor line 3b in the equivalent circuit (see FIG. 2). A fixed potential is applied to the second capacitor electrode 16a. With this, a potential applied to the pixel electrode 15 through the drain electrode 32 of the TFT 30 can be held between the second capacitor electrode 16a and the first capacitor electrode 16b.

Figure 6A:
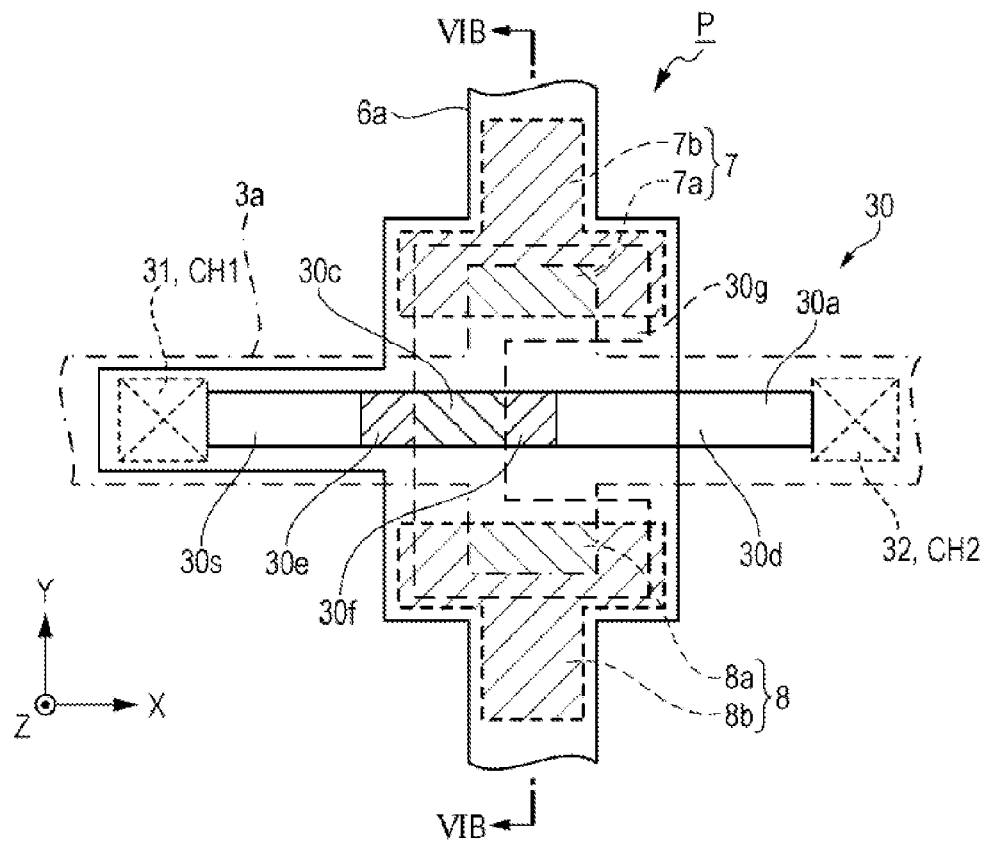
FIGS. 6A and 6B are views illustrating a configuration of an intersection of non-opening regions in the liquid crystal device according to the first embodiment.
Figure 6B:
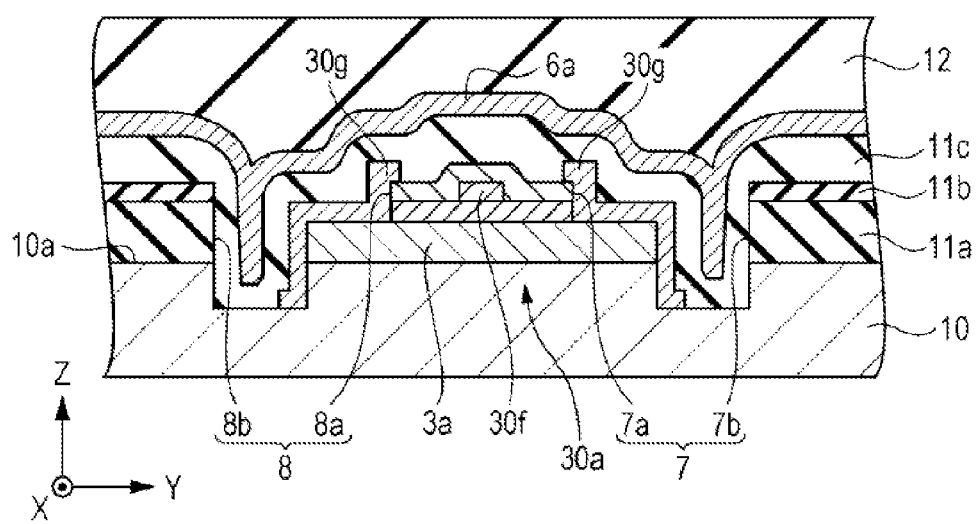
Figure 8A:
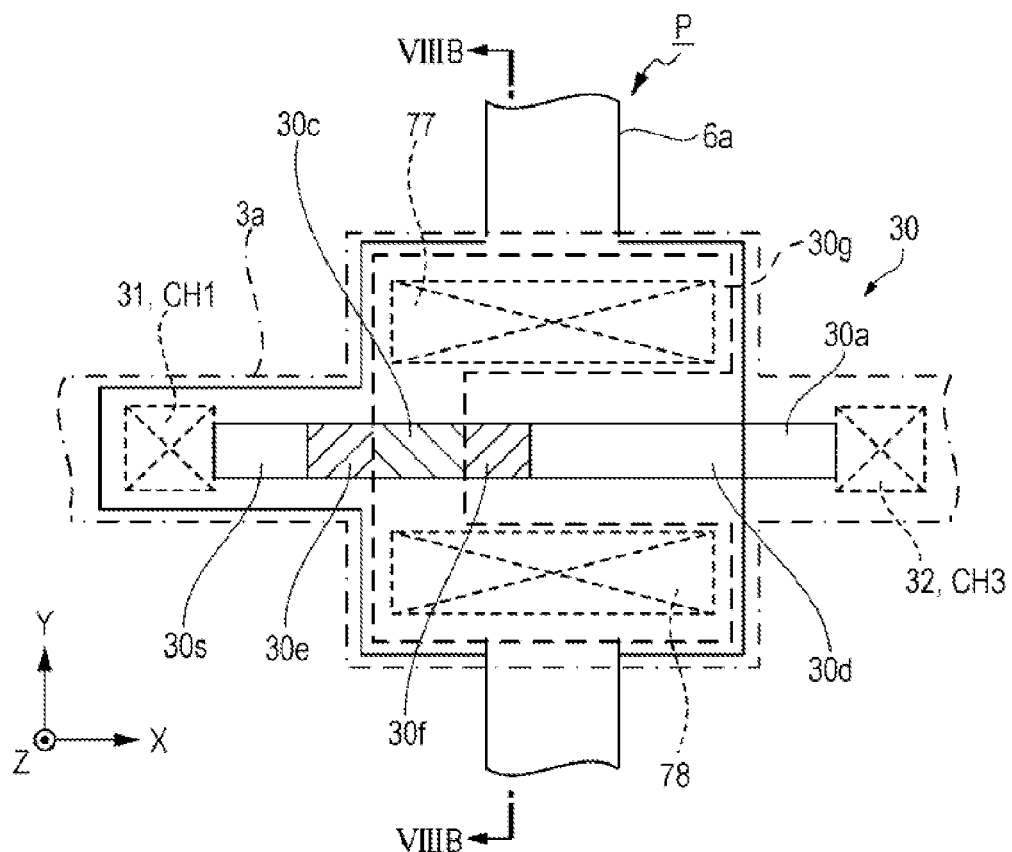
FIGS. 8A and 8B are views illustrating an example of a configuration of an intersection of non-opening regions in an existing technique.
Figure 8B:
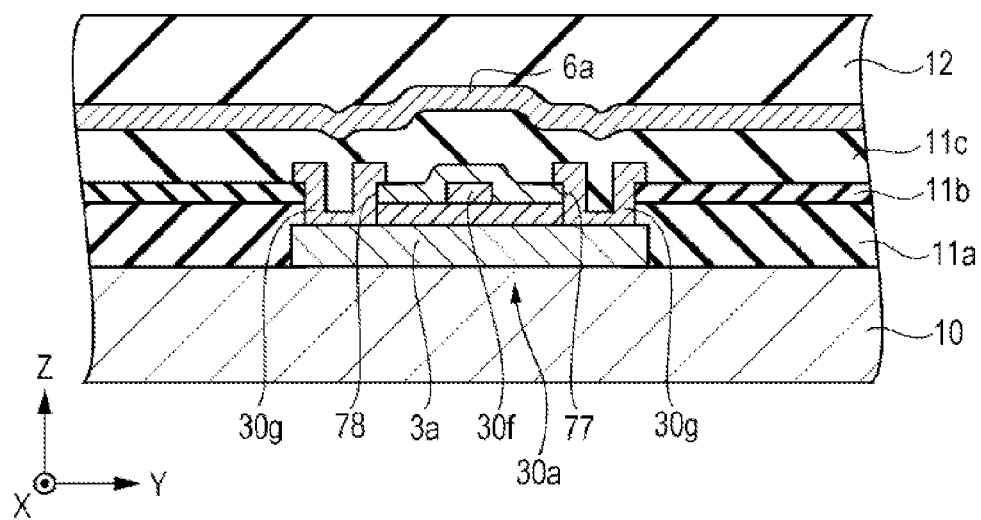

Next, a configuration of each intersection of the non-opening regions is described in comparison with a configuration of the intersection in the existing technique. FIGS. 6A and 6B are views illustrating a configuration of each intersection of the non-opening regions in the liquid crystal device according to the first embodiment. To be more specific, FIG. 6A is a schematic plan view illustrating a configuration of the intersection and FIG. 6B is a schematic cross-sectional view cut along a line VIB-VIB in FIG. 6A. FIGS. 8A and 8B are views illustrating an example of a configuration of an intersection of non-opening regions in the existing technique. To be more specific, FIG. 8A is a schematic plan view illustrating an example of the configuration of the intersection in the existing technique and FIG. 8B is a schematic cross-sectional view cut along a line VIIIB-VIIIB in FIG. 8A. It is to be noted that in FIGS. 6A and 6B and FIGS. 8A and 8B, constituent components in the upper layers relative to the insulating interlayer 12 are not illustrated.

First, the configuration of the intersection of the non-opening regions according to the embodiment is described with reference to FIGS. 6A and 6B. As illustrated in FIG. 6A, the recess 7 and the recess 8 are arranged so as to oppose each other in the Y direction with the semiconductor layer 30a interposed therebetween when seen from the above.

The recess 7 includes the first recess 7a and the second recess 7b. The first recess 7a overlaps with the scan line 3a when seen from the above. The second recess 7b extends to the outer side of the scan line 3a from the first recess 7a. The second recess 7b has a portion extending to the side opposite to the semiconductor layer 30a along the Y direction so as to overlap with the data line 6a when seen from the above.

The recess 8 includes the first recess 8a and the second recess 8b. The first recess 8a overlaps with the scan line 3a when seen from the above. The second recess 8b extends to the outer side of the scan line 3a from the first recess 8a. The second recess 8b has a portion extending to the side opposite to the semiconductor layer 30a along the Y direction so as to overlap with the data line 6a when seen from the above. Accordingly, the recess 7 and the recess 8 have projecting shapes when seen from the above.

As illustrated in FIG. 6B, the first recess 7a and the first recess 8a reach the scan line 3a while penetrating through the gate insulating layer 11b and the foundation insulating layer 11a. The second recess 7b and the second recess 8b are formed so as to penetrate through the gate insulating layer 11b and the foundation insulating layer 11a and are recessed from the upper surface 10a of the element substrate 10.

For example, the recesses 7 and 8 having the above-mentioned configuration can be formed by dry etching processing or wet etching processing by using a mask having openings corresponding to the regions of the recesses 7 and 8. When the etching processing for forming the recesses 7 and 8 is performed, etching gas or etchant that makes an etching selection ratio of a material of the element substrate 10 extremely higher than that of a formation material of the scan line 3a should be desirably used.

With this, in the region overlapping with the scan line 3a when seen from the above, the gate insulating layer 11b and the foundation insulating layer 11a are etched until the scan line 3a is exposed, thereby forming the first recess 7a and the first recess 8a. Further, in the region not overlapping with the scan line 3a, the gate insulating layer 11b and the foundation insulating layer 11a are etched and a part of the element substrate 10 at the upper surface 10a side is etched, thereby forming the second recess 7b and the second recess 8b.

The gate electrode 30g is formed across a part of the second recess 7b from the first recess 7a and is formed across a part of the second recess 8b from the first recess 8a. To be more specific, the gate electrode 30g is formed on the scan line 3a in the first recess 7a and the first recess 8a. Further, the gate electrode 30g is formed as far as the lower side relative to the scan line 3a along the wall portion of the second recess 7b at the first recess 7a side from the first recess 7a continuously. In addition, the gate electrode 30g is formed as far as the lower side relative to the scan line 3a along the wall portion of the second recess 8b at the first recess 8a side from the first recess 8a continuously.

Accordingly, the gate electrode 30g makes contact with the upper surface of the scan line 3a in the first recess 7a and the first recess 8a, and makes contact with the side surfaces of the scan line 3a in the second recess 7b and the second recess 8b. It is to be noted that the gate electrode 30g may be formed to reach the bottom portions of the second recess 7b and the second recess 8b along the wall portions thereof.

The insulating interlayer 11c is formed across the second recess 7b from the first recess 7a and across the second recess 8b from the first recess 8a so as to cover the gate electrode 30g. In the second recess 7b and the second recess 8b, the insulating interlayer 11c is formed being extended down to the bottom portions along the wall portions.

The data line 6a is formed so as to cover the insulating interlayer 11c. Further, the data line 6a is formed as far as the lower side relative to the scan line 3a along the gate electrode 30g with the insulating interlayer 11c interposed between the data line 6a and the gate electrode 30g while the data line 6a being extended into the inner portion of the second recess 7b and the inner portion of the second recess 8b. With this, the lateral sides at both sides in the Y direction with the semiconductor layer 30a (channel region 30c and junction region 30f) interposed therebetween are doubly light-shielded as far as the lower side relative to the scan line 3a by the gate electrode 30g and the data line 6a.

As described above, the semiconductor layer 30a of the TFT 30 is provided on the non-opening region on which the scan line 3a, the data line 6a, the shield layer 35, the first capacitor electrode 16b, and the second capacitor electrode 16a overlap with one another, and is light-shielded when seen from the above. At the same time, the lateral sides of the semiconductor layer 30a of the TFT 30 are also light-shielded by the gate electrode 30g and the data line 6a. That is to say, employed is a three-dimensional light-shielding structure in which even when light is incident on the pixel P from various directions, the light is not incident on at least the channel region 30c and the junction region 30f of the semiconductor layer 30a.

On the other hand, as illustrated in FIG. 8A, recesses 77 and 78 functioning as contact holes are arranged at both the sides of the semiconductor layer 30a at the intersection of the non-opening regions in the existing technique. The scan line 3a has enlarged portions at each intersection between the scan line 3a and the data line 6a, for example. The enlarged portions are enlarged in the X and Y directions and have square shapes when seen from the above. The recesses 77 and 78 have rectangular shapes that are longer in the X direction when seen from the above, for example, and are provided in the regions of the enlarged portions of the scan line 3a. Accordingly, the lengths of the recesses 77 and 78 in the Y direction are smaller than the lengths of the recesses 7 and 8 in the Y direction in the embodiment.

As illustrated in FIG. 8B, the recesses 77 and 78 reach the scan line 3a while penetrating through the gate insulating layer 11b and the foundation insulating layer 11a. The gate electrode 30g is formed so as to be extended into the inner portions of the recesses 77 and 78 and makes contact with the scan line 3a in the recesses 77 and 78.

The insulating interlayer 11c is formed so as to cover the gate electrode 30g. The insulating interlayer 11c is formed so as to fill inner portions of the recesses 77 and 78 in which the gate electrode 30g is not formed because the lengths (widths) of the recesses 77 and 78 in the Y direction are smaller than those of the recesses 7 and 8 in the embodiment.

The data line 6a is formed so as to cover the insulating interlayer 11c while not being extended into the inner portions of the recesses 77 and 78 because the inner portions of the recesses 77 and 78 are filled with the insulating interlayer 11c. Further, even when the data line 6a is extended into the inner portions of the recesses 77 and 78, the data line 6a does not reach the bottom portions (scan line 3a) of the recesses 77 and 78 because the insulating interlayer 11c is interposed between the data line 6a and the gate electrode 30g.

Thus, with the configuration of the intersection of the non-opening regions in the existing technique, the semiconductor layer 30a of the TFT 30 is provided on the non-opening region on which the scan line 3a, the data line 6a, the shield layer 35, the first capacitor electrode 16b, and the second capacitor electrode 16a (the shield layer 35, the first capacitor electrode 16b, and the second capacitor electrode 16a are not illustrated in FIGS. 8A and 8B) overlap with one another, and is light-shielded when seen from the above.

However, the lateral sides of the semiconductor layer 30a of the TFT 30 are light-shielded only by the gate electrode 30g. Accordingly, the blocking of light that is incident on the semiconductor layer 30a obliquely is insufficient in the following cases. That is, the blocking of light is insufficient in the case where a portion on which a conductive film is not formed is generated partially when conductive films are formed in the recesses 77 and 78 to form the gate electrode 30, and the case where the light shielding property of the gate electrode 30 is lowered by anneal processing. Due to this, the light leakage current in the TFT 30 is increased and optical malfunction occurs, resulting in occurrence of flicker and pixel unevenness. This raises a problem that display quality of the liquid crystal device is lowered.

On the other hand, as illustrated in FIGS. 6A and 6B, with the configuration of the intersection of the non-opening regions in the embodiment, the recesses 7 and 8 include the first recesses 7a and 8a and the second recesses 7b and 8b. The first recesses 7a and 8a overlap with the scan line 3a when seen from the above. The second recesses 7b and 8b are enlarged to the outer sides of the scan line 3a from the first recesses 7a and 8a, respectively. Further, the second recesses 7b and 8b include the portions extending along the Y direction in which the data line 6a extends. Therefore, the data line 6a can be formed so as to enter the inner portions of the second recesses 7b and 8b easily in comparison with the configuration of the intersection of the non-opening regions in the existing technique.

In addition, the second recesses 7b and 8b are formed so as to be recessed from the upper surface 10a of the element substrate 10. The gate electrode 30g and the data line 6a are formed as far as the lower side relative to the scan line 3a in the second recesses 7b and 8b. Therefore, the gate electrode 30g and the data line 6a can block the light on the lateral sides of the semiconductor layer 30a of the TFT 30 as far as the lower side relative to the scan line 3a. That is to say, light that is incident on the semiconductor layer 30a of the TFT 30 obliquely can be also blocked reliably by a three-dimensional light-shielding structure of not only blocking light incident on the semiconductor layer 30a when seen from the above but also blocking light incident on the lateral sides thereof. This makes it possible to provide the liquid crystal device 1 that includes the TFTs 30 which can obtain stable driving states for the incident light, and has high display quality.

Second Embodiment

Electronic Apparatus

Figure 7:
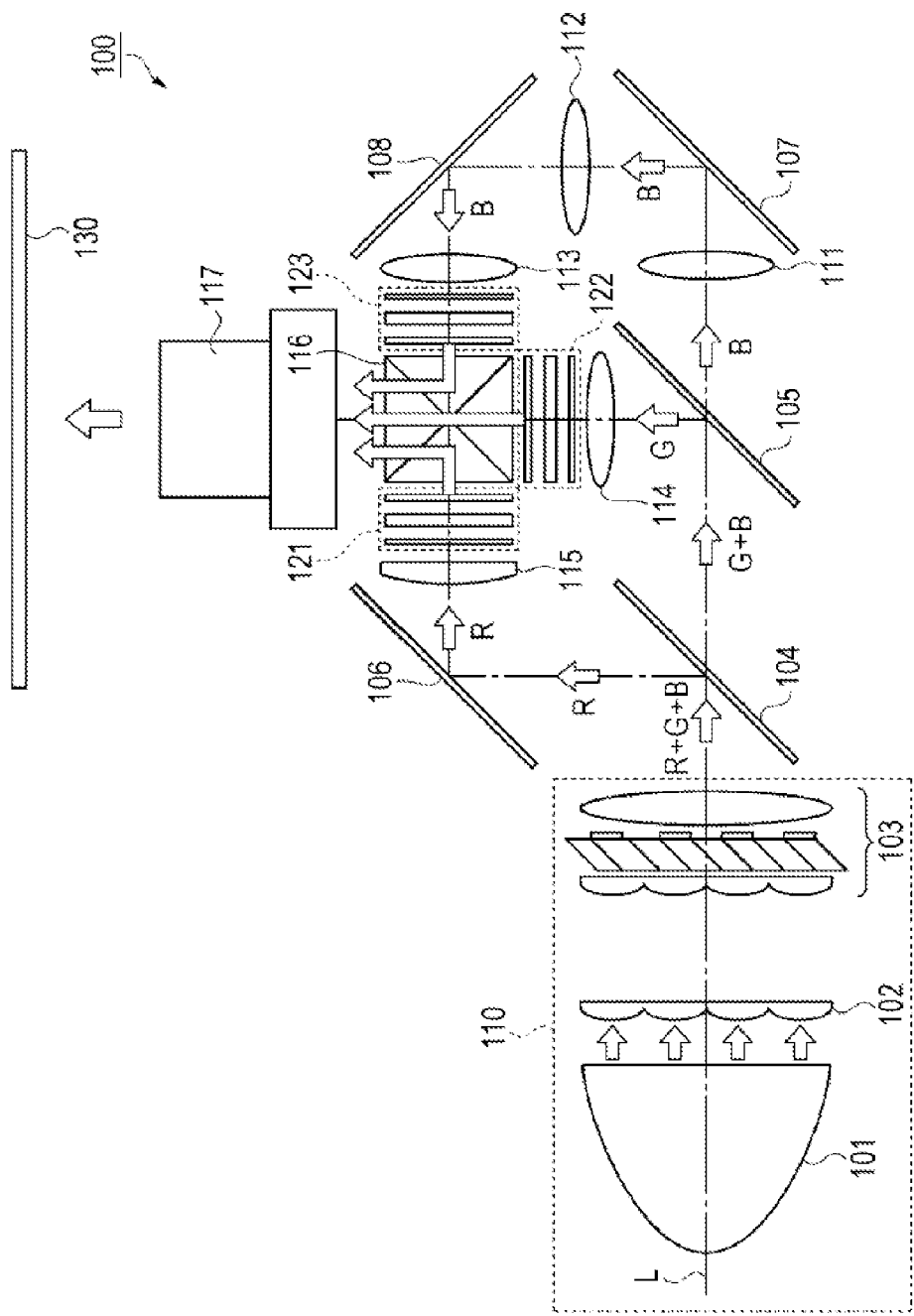
FIG. 7 is a schematic view illustrating a configuration of a projector as an electronic apparatus according to a second embodiment.

Next, an electronic apparatus according to a second embodiment is described with reference to FIG. 7. FIG. 7 is a schematic view illustrating a configuration of a projector as the electronic apparatus according to the second embodiment.

As illustrated in FIG. 7, a projector (projection-type display apparatus) 100 as the electronic apparatus according to the second embodiment includes a polarized illumination device 110, two dichroic mirrors 104 and 105 as light separation elements, three reflecting mirrors 106, 107, and 108, five relay lenses 111, 112, 113, 114, and 115, three liquid crystal light valves 121, 122, and 123, a cross dichroic prism 116 as a light combination element, and a projection lens 117.

The polarized illumination device 110 includes a lamp unit 101 as a light source, an integrator lens 102, and a polarization converting element 103. The lamp unit 101 is formed by a white light source such as an ultrahigh pressure mercury lamp and a halogen lamp, for example. The lamp unit 101, the integrator lens 102, and the polarization converting element 103 are arranged along a system optical axis L.

The dichroic mirror 104 reflects red light (R) and transmits green light (G) and blue light (B) among polarized light beams emitted from the polarized illumination device 110. The other dichroic mirror 105 reflects the green light (G) that has passed through the dichroic mirror 104 and transmits the blue light (B).

The red light (R) reflected by the dichroic mirror 104 is reflected by the reflecting mirror 106, and then, enters the liquid crystal light valve 121 through the relay lens 115. The green light (G) reflected by the dichroic mirror 105 enters the liquid crystal light valve 122 through the relay lens 114. The blue light (B) that has passed through the dichroic mirror 105 enters the liquid crystal light valve 123 through a light guide system constituted by the three relay lenses 111, 112, and 113 and the two reflecting mirrors 107 and 108.

The transmissive liquid crystal light valves 121, 122, and 123 as light modulators are arranged so as to oppose incident surfaces of the cross dichroic prism 116 for respective color light components. The color light components that enters the liquid crystal light valves 121, 122, and 123 are modulated based on video image information (video image signal) and are emitted to the cross dichroic prism 116.

The cross dichroic prism 116 is constituted by bonding four rectangular prisms. A dielectric multilayer film that reflects red light and a dielectric multilayer film that reflects blue light are formed on the inner surfaces thereof in a cross shape. The light components of the three colors are then synthesized by these dielectric multilayer films to form light representing a color image. The synthesized light is projected onto a screen 130 by the projection lens 117 as a projection optical system, so that the image is displayed in an enlarged manner.

The liquid crystal device 1 according to the first embodiment is applied to the liquid crystal light valve 121. The liquid crystal light valve 121 is arranged between a pair of polarization elements arranged at the incident side and the output side of the color light in a crossed Nichol system with a space therebetween. The other liquid crystal light valves 122 and 123 are arranged in the same manner.

With the configuration of the projector 100 according to the second embodiment, the projector 100 includes the liquid crystal devices 1. The liquid crystal device 1 has high aperture ratios of the pixel regions through which light passes, and can suppress generation of optical leakage currents in the TFTs 30 even when a plurality of pixels P are arranged in a high definition. This makes it possible to provide the projector 100 that has high quality and gives light display.

The above-mentioned embodiments indicate merely one aspect of the invention and arbitrary variations and applications can be made within the scope of the invention. The following variations can be considered.

First Variation

The liquid crystal device 1 according to the above-mentioned embodiment is a transmissive liquid crystal device in which the pixel electrodes 15 and the common electrode 23 are formed by conductive films having light transmissivity. However, the invention is not limited to the embodiment. The pixel electrodes 15 or the common electrode 23 of the liquid crystal device 1 may be formed by a conductive film having light reflectivity, such as aluminum, so that a reflection-type liquid crystal device may be configured. If the pixel electrodes 15 are formed by a light-reflective conductive film, light entering from the counter substrate 20 side is optically modulated while being reflected by the element substrate 10 side (pixel electrodes 15) and emitted from the counter substrate 20 side. If the common electrode 23 is formed by the light-reflective conductive film, the light entering from the element substrate 10 side is optically modulated while being reflected by the counter substrate 20 side (common electrode 23) and emitted from the element substrate 10 side.

Second Variation

The electronic apparatus (projector 100) according to the above-mentioned embodiment includes the three liquid crystal light valves 121, 122, 123 to which the liquid crystal devices 1 are applied. However, the invention is not limited to the embodiment. The electronic apparatus may have a configuration including equal to or less than two liquid crystal light valves (liquid crystal devices 1) or including equal to or more than four liquid crystal light valves (liquid crystal devices 1).

Third Variation

The electronic apparatus to which the liquid crystal device 1 according to the above-mentioned embodiment can be applied is not limited to the projector 100. The liquid crystal device 1 can be preferably applied to a projection-type head up display (HUD) and a direct view-type head mount display (HMD), for example. In addition, the liquid crystal device 1 can be preferably applied to display units of information terminal apparatuses such as an electronic book, a personal computer, a digital still camera, a liquid crystal television, a view finder-type or a monitor direct view-type video recorder, a car navigation system, an electronic organizer, and a point of sale (POS) terminal.

The entire disclosure of Japanese Patent Application No. 2013-006992, filed Jan. 18, 2013 is expressly incorporated by reference herein.

What is claimed is:

1. An electrooptic device substrate comprising:
a substrate;
a switching element having a semiconductor layer and a gate electrode;
a scan line that extends in a first direction, the scan line shielding a light;
a first insulating layer that covers the substrate and the scan line, the semiconductor layer covering the first insulating layer and the scan line in a plan view;
a second insulating layer that covers the first insulating layer and the semiconductor layer;
a first recess that is disposed at one side of the semiconductor layer in the plan view;
a second recess that is disposed at another side of the semiconductor layer in the plan view, the first recess and the second recess penetrating through the first insulating layer, the second insulating layer, and a portion of the substrate, the first recess, the semiconductor layer, and the second recess being arranged in a second direction intersecting with the first direction in the plan view, the gate electrode covering the second insulating layer, the scan line, and a channel region of the semiconductor layer in the plan view, the gate electrode being electrically connected to the scan line via the first recess and the second recess;
a third insulating layer that covers the second insulating layer, the gate electrode, the first recess, and the second recess; and
a data line that covers the third insulating layer so as to extend in the second direction, the data line overlapping with the scan line, the semiconductor layer, the gate electrode, the first recess and the second recess in the plan view, the data line shielding a light,
wherein the first recess includes a first part that overlaps with the scan line in the plan view and a second part that is disposed at a first side of the first part, the first side being an opposite side of a semiconductor layer side of the first part, and
wherein the second recess includes a third part that overlaps with the scan line in the plan view and a fourth part that is disposed at a second side of the third part, the second side being an opposite side of a semiconductor layer side of the third part.

2. The electrooptic device substrate according to claim 1, wherein
the second part and the fourth part extend along to the second direction in the plan view.

3. The electrooptic device substrate according to claim 2, wherein
the second part and the fourth part penetrate to the substrate, and
the gate electrode covers the scan line in the first part and the third part, and the gate electrode covers a side surface of the scan line in the second part and the fourth part.

4. The electrooptic device substrate according to claim 3, wherein
the data line covers the side surface of the scan line in the second part and the fourth part.

5. An electrooptic device comprising: the electrooptic device substrate according to claim 1.

6. An electrooptic device comprising: the electrooptic device substrate according to claim 2.

7. An electrooptic device comprising: the electrooptic device substrate according to claim 3.

8. An electrooptic device comprising: the electrooptic device substrate according to claim 4.

9. An electronic apparatus comprising a projector, a head up display, or a head mount display that includes the electrooptic device according to claim 5.

10. An electronic apparatus comprising a projector, a head up display, or a head mount display that includes the electrooptic device according to claim 6.

11. An electronic apparatus comprising a projector, a head up display, or a head mount display that includes the electrooptic device according to claim 7.

12. An electronic apparatus comprising a projector, a head up display, or a head mount display that includes the electrooptic device according to claim 8.

* * * * *